United States Patent
Liao et al.

(10) Patent No.: US 6,888,181 B1
(45) Date of Patent: May 3, 2005

(54) TRIPLE GATE DEVICE HAVING STRAINED-SILICON CHANNEL

(75) Inventors: Wen-Shiang Liao, Miao-Li Hsien (TW); Wei-Tsun Shiau, Kao-Hsiung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/708,694

(22) Filed: Mar. 18, 2004

(51) Int. Cl.[7] .......................................... H01L 31/0328
(52) U.S. Cl. .................................................... 257/192
(58) Field of Search ........................ 257/192, 331–369

(56) References Cited

U.S. PATENT DOCUMENTS

| 4,996,574 A | 2/1991 | Shirasaki |
| 5,338,959 A | 8/1994 | Kim et al. |
| 6,413,802 B1 | 7/2002 | Hu et al. |
| 6,727,546 B2 * | 4/2004 | Krivokapic et al. |
| 6,764,884 B1 * | 7/2004 | Yu et al. ..................... 438/157 |
| 6,838,322 B2 * | 1/2005 | Pham et al. |

* cited by examiner

Primary Examiner—Fetsum Abraham
(74) Attorney, Agent, or Firm—Winston Hsu

(57) ABSTRACT

A three-dimensional Triple-Gate (Tri-gate) device having a three-sided strained silicon channel and superior drive current is provided. The Tri-gate device includes a composite fin structure consisting of a silicon germanium core and a three-sided strained silicon epitaxy layer grown from surface of said silicon germanium core. A gate strip wraps a channel portion of the composite fin structure. Two distal end portions of the composite fin structure not covered by the gate strip constitute source/drain regions of the Tri-gate device. A high quality gate insulating layer is interposed between the composite fin structure and the gate strip.

10 Claims, 6 Drawing Sheets

TRIPLE GATE DEVICE HAVING STRAINED-SILICON CHANNEL

BACKGROUND OF INVENTION

1. Field of the Invention

The present invention relates to a Triple Gate(Tri-gate) device, and more particularly, to a three dimensional transistor device having a three-sided strained-Si channel and its manufacturing method.

2. Description of the Prior Art

Transistors are the miniscule on/off switches that make up the integrated circuits in today's microprocessors. Three dimensional (3D) vertical double-gate transistors are known in the art. Chipmakers keep announcing that they have fabricated the smallest vertical double-gate transistors reported to date using industry standard technology. These transistors, measuring below ten nanometers, or ten billionths of a meter in length (gate), are about six times smaller than the smallest transistors currently in production.

A double-gate transistor structure effectively doubles the electrical current that can be sent through a given transistor. The Fin Field Effect Transistor (FinFET) design relies upon a thin vertical silicon "fin" to help control leakage of current through the transistor when it is in the "off" stage. Moreover, while the gate length is shrunk to bellow 65 nm, the wrapped-around gate upon the very thin Si-fin body can provide excellent gate control capability for effectively suppressing short channel effect through the fully depleted silicon-on-insulator (SOI) operation mode. The superior leakage control characteristics and excellent gate control for effectively suppressing short channel effect make FinFET transistors an attractive candidate for future nano-scale CMOS generations, which are expected to be in manufacturing within the next decade.

Typically, FinFET is built on a silicon-on-insulator (SOI) substrate. The silicon layer of the SOI substrate is etched into "fin" like shaped body of the transistor. The gate is wrapped around and over the fin.

U.S. Pat. No. 4,996,574 filed Jun. 30, 1989 by Shirasaki, entitled "MIS transistor structure for increasing conductance between source and drain regions" discloses a metal-insulator-semiconductor transistor comprising an insulator layer, a silicon body provided on the insulator layer and comprising a source region, a drain region and a channel region extending in a first direction between and interconnecting the source region and the drain region, a gate insulator film provided on the silicon body so as to cover the channel region except for the part of the channel region in contact with the insulator layer, and a gate electrode of a conductive material provided in contact with the gate insulator film so as to cover the channel region underneath the gate insulator film except for the part of the channel region in contact with the insulator layer.

U.S. Pat. No. 5,338,959 filed Mar. 30, 1993 by Kim et al. discloses a thin film transistor gate structure with a three-dimensional multi-channel structure. The thin film transistor gate structure comprises source/drain electrodes formed so as to be spaced from and opposite to each other on a substrate. The TFT has a plurality of channel regions for high carrier mobility. Each channel region has three-dimensional structure. The polycrystalline silicon channel regions are surrounded by gates.

U.S. Pat. No. 6,413,802 filed on Oct. 23, 2000 by Hu et al. discloses a FinFET device that is fabricated using conventional planar MOSFET technology. The device is fabricated in a silicon layer overlying an insulating layer (e.g., SIMOX) with the device extending from the insulating layer as a fin. Double gates are provided over the sides of the channel to provide enhanced drive current and effectively suppress short channel effects. A plurality of channels can be provided between a source and a drain for increased current capacity.

However the electrical performance such as carrier mobility or device driving current of the above-described SOI-based FinFET and Tri-gate devices can be further improved.

SUMMARY OF INVENTION

It is therefore a primary object of the claimed invention to provide a Triple Gate (Tri-gate) device having improved electrical performance such as higher carrier mobility and higher driving current.

According to the claimed invention, a Tri-gate device with a strained silicon channel is provided. The Tri-gate device includes a composite fin structure consisting of a silicon germanium core and a strained silicon epitaxy layer grown from surface of said silicon germanium core. A gate strip wraps a channel portion of the composite fin structure. Two distal end portions of the composite fin structure not covered by the gate strip constitute source/drain regions of the Tri-gate device. A gate insulating layer is interposed between the composite fin structure and the gate strip.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
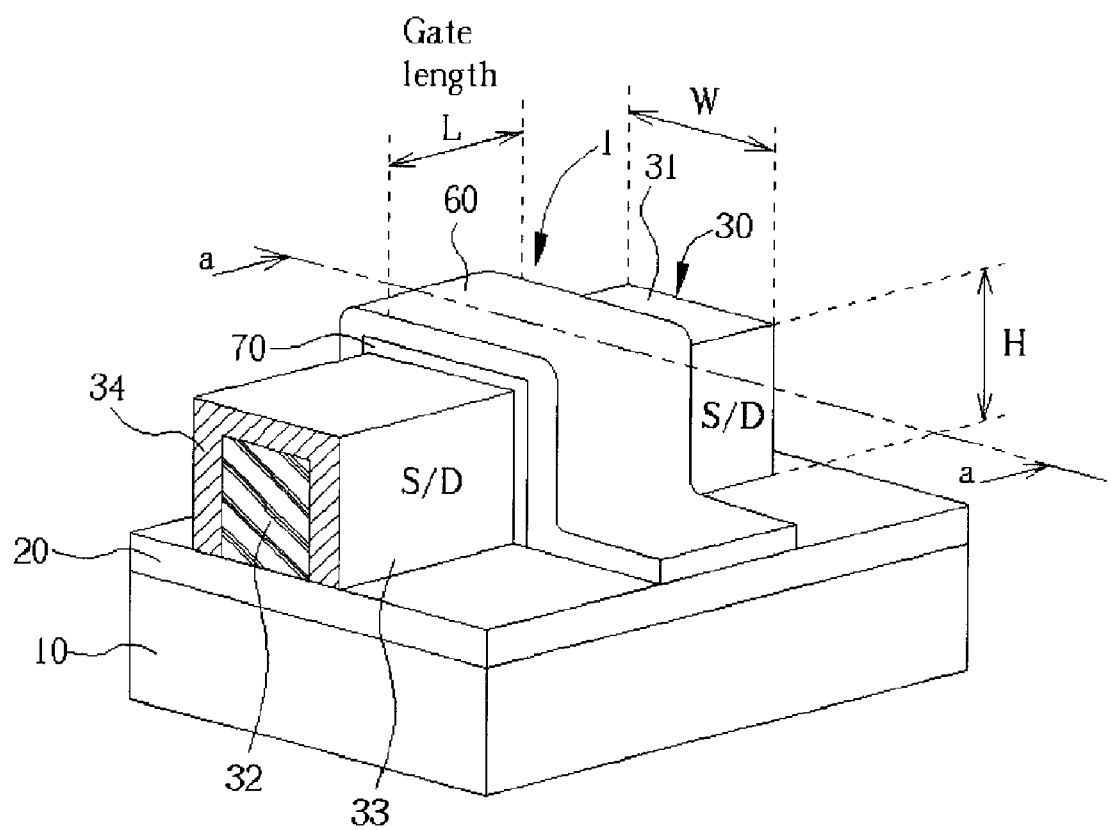
FIG. 1 is a schematic perspective view showing a portion of an improved Tri-gate device in accordance with one preferred embodiment of the present invention.
Figure 2:
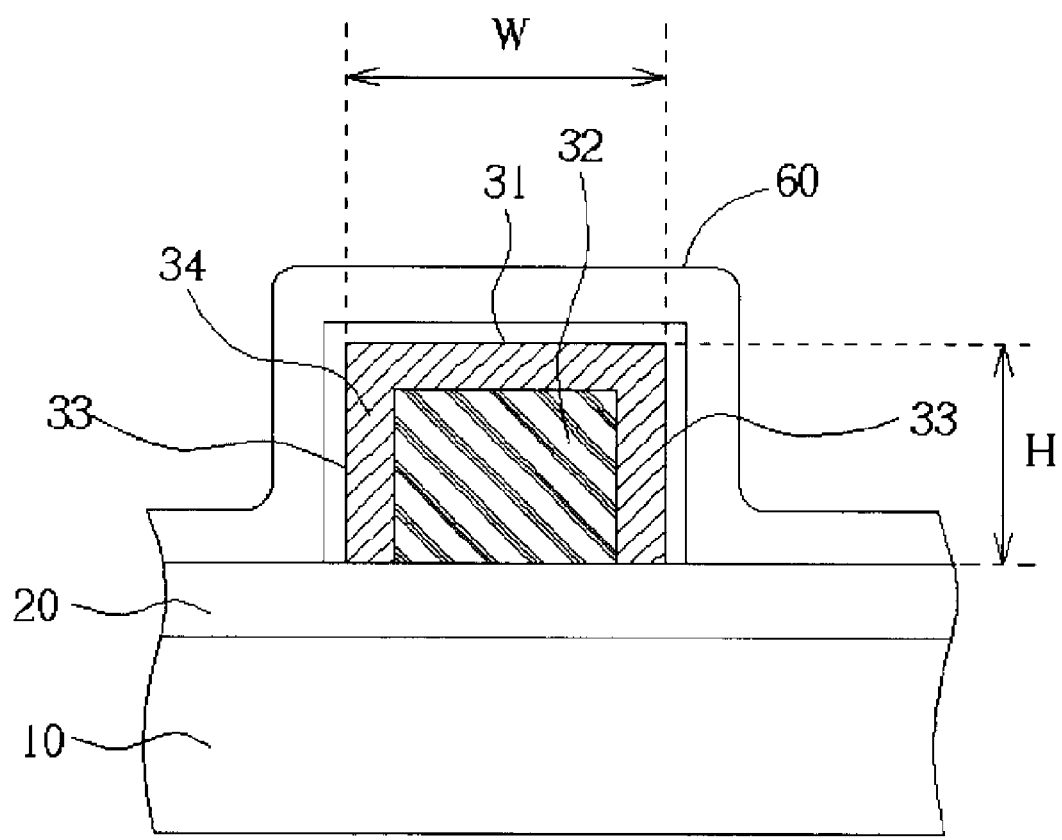
FIG. 2 is a cross-sectional view of the Tri-gate device along line a—a of FIG. 1.

Please refer to FIG. 1 and FIG. 2. FIG. 1 is a schematic perspective view showing a germane portion of an improved Tri-gate device in accordance with one preferred embodiment of the present invention. FIG. 2 is a cross-sectional view of the Tri-gate device along line a—a of FIG. 1. As shown in FIG. 1, the Tri-gate device 1 comprises a thin fin structure 30 upwardly extending from a horizontal surface of an insulating layer (or buried oxide) 20 that is supported by a substrate 10. The thin fin structure 30 standing perpendicular to the substrate 10 is separated from the substrate 10 by the insulating layer 20. The center portion of the thin fin structure 30 is wrapped by a gate strip 60 and defines a channel region thereto. A gate insulating film 70 such as high quality silicon dioxide is interposed between the gate strip 60 and the thin fin structure 30. Alternatively, the gate insulating film 70 can be silicon nitride or a high-k gate dielectric material. The gate strip 30 may be made of polysilicon, metal gate or the like. The thin fin portions that are not covered by the gate strip 60 constitute source or drain (S/D) of the Tri-gate device 1. The source/drain (S/D) of the Tri-gate device 1 may be implanted with high concentration of impurities. For the sake of simplicity, it is to be understood that the contact portions electrically connected to the S/D and gate strip 60 respectively are not shown.

As shown in FIG. 1 and FIG. 2, the thin fin structure 30 has a flat top surface 31 having a width denoted as "W", and two vertical sidewalls 33 having a height denoted as "H". The channel length (L) of the Tri-gate device 1 is defined by the width of the gate strip 60. The channel width of the Tri-gate device 1 is the combination of the width (W) of the flat top surface 31 and the height (H) of both sidewalls 33 (Channel width=W+2H). According to the preferred embodiment of the present invention, the width (W) of the flat top surface 31 is approximately equal to the height (H) of sidewall 33. Preferably, the strained silicon epitaxy layer 34 has a substantially uniform thickness of about 10~300 angstroms. The present invention features the thin fin structure 30 that comprises a silicon germanium ($Si_xGe_{1-x}$) core 32 and a strained silicon epitaxy layer 34 grown from surface of the silicon germanium core 32. The electrical performance of the Tri-gate device 1 can be greatly improved since the strained silicon epitaxy layer 34 provides superior carrier mobility, and thus higher drive current.

Figure 3:
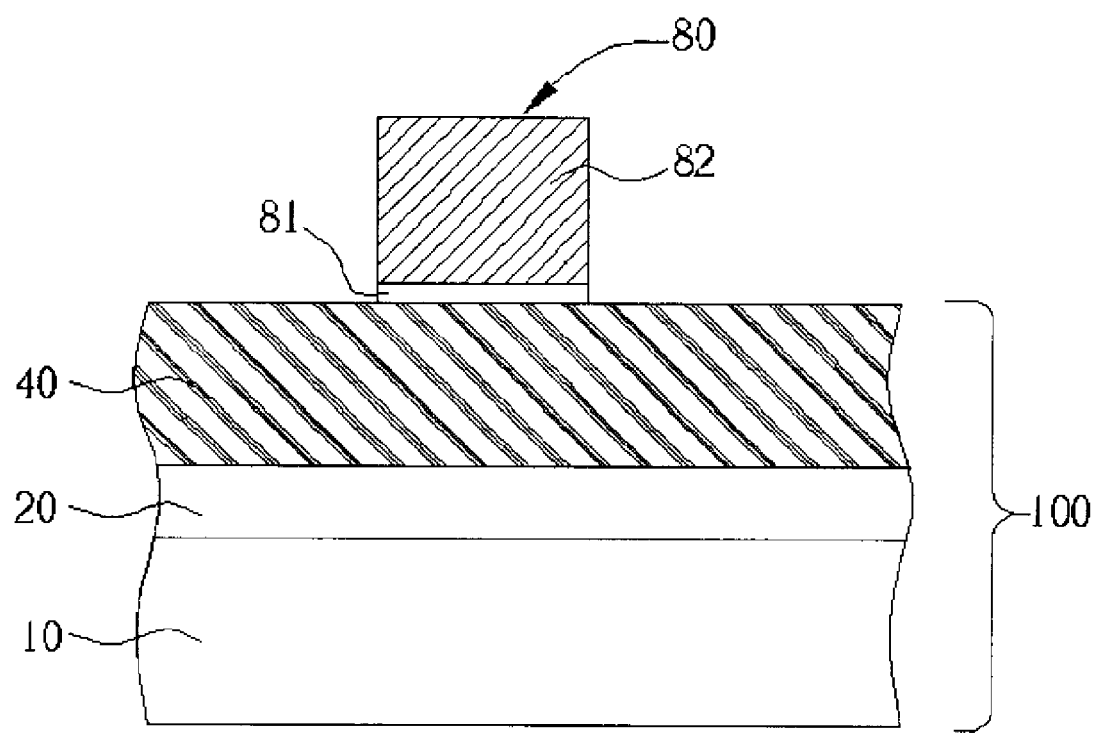
FIG. 3 to FIG. 6 are schematic cross-sectional diagrams showing the method for fabricating the Tri-gate device in accordance with one preferred embodiment of the present invention.
Figure 4:
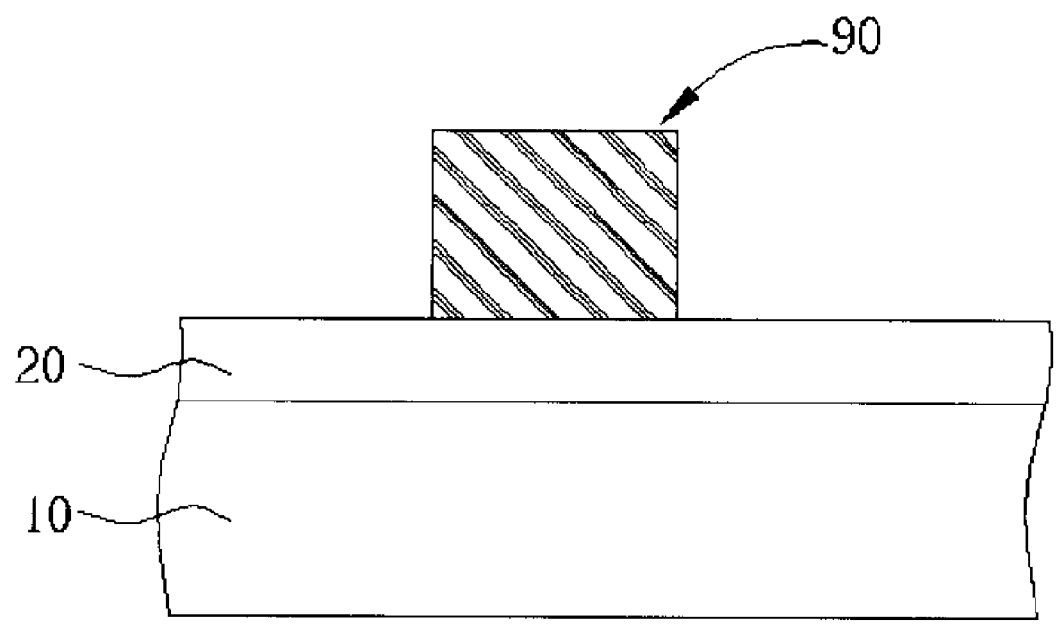

A method for forming the Tri-gate device 1 of FIG. 1 will now be explained with reference to FIG. 3 to FIG. 6. As shown in FIG. 3, a commercially available uni-bond $Si_xGe_{1-x}$/$SiO_2$/Si wafer 100 is prepared. The uni-bond $Si_xGe_{1-x}$/$SiO_2$/Si wafer 100 comprises a silicon bottom layer 10, $SiO_2$ film 20 supported by the silicon bottom layer 10, and a silicon germanium layer 40. Preferably, the silicon germanium layer 40 has a predetermined thickness of about 500~1200 angstroms, but not limited thereto. An etching mask 80 is formed on the silicon germanium layer 40. The etching mask 80 may include a silicon nitride hard mask 81 and a photoresist 82. A reactive ion etching (RIE) is carried out to etch away the un-masked silicon germanium layer 40 from the wafer 100. The anisotropic RIE stops on the $SiO_2$ film 20. The remaining photoresist 81 and hard mask 82 are removed, thereby forming a silicon germanium island 90 on the $SiO_2$ film 20.

Figure 5:
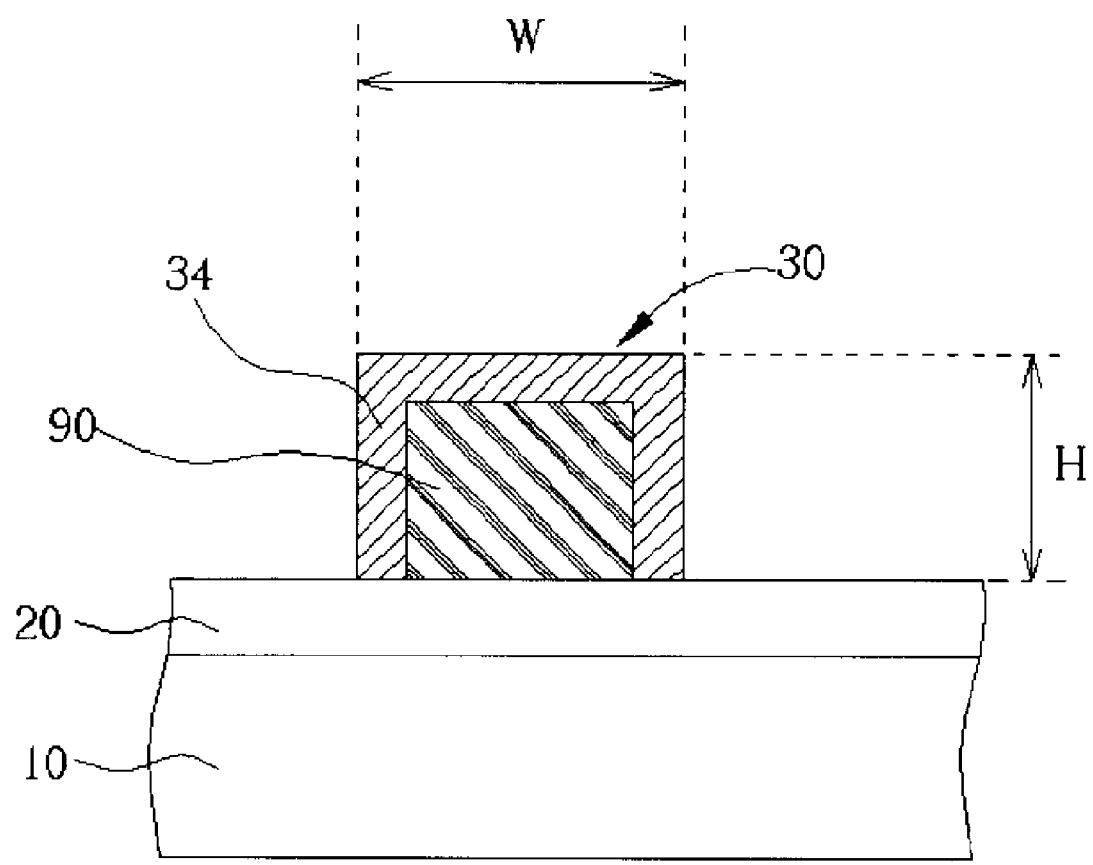

As shown in FIG. 5, an epitaxy process is performed to grow a strained silicon layer 34 on the surface of the silicon germanium island 90. The grown strained silicon layer 34 and the silicon germanium island 90 constitute a composite thin fin structure 30, part of which will be used as the channel region in a later stage. As specifically indicated in FIG. 5, the composite thin fin structure 30 has a width (top surface) denoted as "W" and a height (sidewalls) denoted as "H". According to the preferred embodiment of the present invention, the width (W) of the composite thin fin structure 30 is approximately equal to the height (H) of the composite thin fin structure 30. Preferably, the strained silicon epitaxy layer 34 has a uniform thickness of about 50~300 angstroms. Channel threshold voltage ($V_t$) implantation may be carried out after the formation of the composite thin fin structure 30. The channel threshold voltage ($V_t$) adjustment may be tilt angle ion implantation. It is understood that a screen oxide or sacrificial oxide (about 50 Å thick, for example) may be thermally formed on the surface of the composite thin fin structure 30 before the channel threshold voltage ($V_t$) adjustment. This sacrificial oxide is removed prior to the formation of high quality gate insulating layer.

Figure 6:
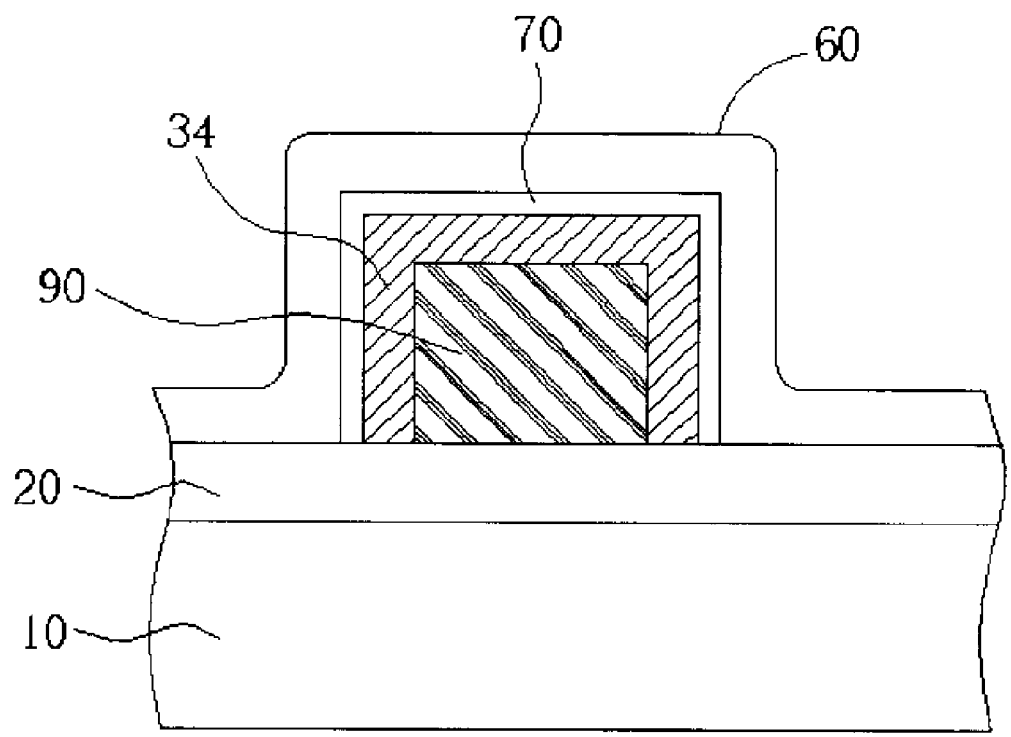

As shown in FIG. 6, a gate insulating layer 70 is formed on the top surface and sidewalls of the composite thin fin structure 30. Preferably, the gate insulating layer 70 is formed by performing a dry or wet thermal oxidation, but not limited thereto. According to the preferred embodiment, the thickness of the gate insulating layer 70 ranges between 10 and 30 angstroms. Subsequently, a conventional chemical vapor deposition (CVD) such as PECVD or LPCVD is carried out to deposit a polysilicon or metal gate layer on the $SiO_2$ film 20 and over the gate insulating layer 70. A lithographic process is then carried out to pattern the polysilicon or metal gate layer, thereby forming a gate strip 60 wrapping a portion of the fin structure 30. An offset spacer (not shown) is then formed on sidewalls of the gate strip 60. A lightly doped source/drain ion implantation may be carried out. After that, a spacer such as silicon nitride (not shown) is formed on the offset spacers. A high concentration source/drain ion implantation is then carried out to dope the source and drain regions on the fin structure 30.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A three dimensional Triple Gate (Tri-gate) device comprising:
   a composite fin structure consisting of a silicon germanium core and a strained silicon epitaxy layer grown from surface of said silicon germanium core;
   a gate strip wrapping a portion of said composite fin structure, wherein portions of said composite fin structure not covered by said gate strip constitute source/drain regions of said Tri-gate device; and
   a gate insulating layer interposed between said composite fin structure and said gate strip.

2. The Tri-gate device of claim 1 wherein said composite fin structure has a substantially flat top surface and vertical sidewalls.

3. The Tri-gate device of claim 2 wherein said composite fin structure has a width of said flat top surface that is approximately equal to its height.

4. The Tri-gate device of claim 1 wherein said strained silicon epitaxy layer has a thickness of about 50~300 angstroms.

5. The Tri-gate device of claim 1 wherein said gate strip is made of polysilicon or metal gate.

6. A Tri-gate device comprising:
   a composite fin structure consisting of a semiconductor core and a strained epitaxy layer grown from surface of said semiconductor core, said semiconductor core having a first lattice constant that miss-matches a second lattice constant of said strained epitaxy layer;
   a gate strip wrapping a portion of said composite fin structure, wherein portions of said composite fin structure not covered by said gate strip constitute source/drain regions of said Tri-gate device; and
   a gate insulating layer interposed between said composite fin structure and said gate strip.

7. The Tri-gate device of claim 6 wherein said semiconductor core consists of silicon germanium.

8. The tri-gate device of claim 6 wherein said strained epitaxy layer is a strained silicon epitaxy layer.

9. The tri-gate device of claim 8 wherein said strained silicon epitaxy layer has thickness of about 50~300 angstroms.

10. The Tri-gate device of claim 6 wherein said gate strip is made of polysilicon or metal gate.

* * * * *